US008647552B2

(12) United States Patent
Jeng et al.

(10) Patent No.: US 8,647,552 B2
(45) Date of Patent: Feb. 11, 2014

(54) METHOD FOR ENHANCING HARDNESS OF NANOIMPRINT MOLD

(75) Inventors: Yeau-Ren Jeng, Tainan (TW); Chung-Ming Tan, Chiayi (TW)

(73) Assignee: National Chung Cheng University, Chia-Yi (TW)

( * ) Notice: Subject to any disclaimer, the term of this patent is extended or adjusted under 35 U.S.C. 154(b) by 253 days.

(21) Appl. No.: 13/279,882

(22) Filed: Oct. 24, 2011

(65) Prior Publication Data

US 2012/0040090 A1 Feb. 16, 2012

Related U.S. Application Data

(63) Continuation-in-part of application No. 12/431,390, filed on Apr. 28, 2009, now abandoned.

(30) Foreign Application Priority Data

May 15, 2008 (TW) .............................. 97117920 A

(51) Int. Cl.
    *B29C 33/38* (2006.01)
(52) U.S. Cl.
    USPC ........................... 264/219; 264/220; 264/293

(58) Field of Classification Search
    USPC .......................................... 264/293, 219, 220
    See application file for complete search history.

(56) References Cited

U.S. PATENT DOCUMENTS

| 2009/0285926 A1* | 11/2009 | Jeng et al. ..................... 425/423 |
| 2010/0098967 A1* | 4/2010 | Schroers et al. .............. 428/600 |
| 2010/0193997 A1* | 8/2010 | Frederickson et al. ....... 264/400 |

* cited by examiner

*Primary Examiner* — Richard Crispino
*Assistant Examiner* — Robert Dye
(74) *Attorney, Agent, or Firm* — Wang Law Firm, Inc.; Li K. Wang; Stephen Hsu

(57) ABSTRACT

The present invention discloses a method for enhancing hardness of a nanoimprint mold comprising following steps of: providing a male mold, composed of a first material, for imprinting a female mold and producing a nano structural pattern on the female mold, and the female mold composed of a second material, wherein the hardness of the first material is higher than the hardness of the second material; applying a nano-indentation technique to the female mold onto the female mold by a nano-indentation apparatus having a diamond array probe so as to enhance the surface hardness of the female mold; and impressing a substrate by the female mold with the nano structural pattern having the enhanced surface.

4 Claims, 5 Drawing Sheets

METHOD FOR ENHANCING HARDNESS OF NANOIMPRINT MOLD

BACKGROUND OF THE INVENTION

1. Field of the Invention

The present invention relates to a method for enhancing the hardness of a nanoimprint mold, and more particularly to a method for enhancing the hardness of a mold by a nano-indentation technique.

2. Description of the Related Art

As science and technology advance rapidly, people have increasingly higher demand on quality and convenience of life, and thus various electronic products are developed to meet customer needs, and a light, thin, low profile, compact and durable product design becomes a tread of development of consumer products. Therefore, materials of higher hardness are used for the manufacture of these products, and a mold of higher hardness is required for enhancing the durability of the products. However, making a mold with a material of high hardness comes with a higher level of difficulty and incurs a higher cost. On the other hand, the durability is not good enough for its requirement, if materials with lower hardness and a lower cost are used for the manufacture.

A micro manufacturing process, such as photolithography plays a very important role in a semiconductor fabrication process. As related semiconductor fabrication process technologies and photolithographic equipments advance continuously, the photolithography encounters a bottleneck of the optical imaging technology since the wavelength of light exposure is reduced. To cope with the requirements of the micro manufacture and nano manufacture, the traditional photolithography has to reduce the wavelength of the light source to comply with the trend of light, thin, low profile and compact products, but the related light sources and peripheral systems are expensive and the related manufacturing processes are time consuming, and thus the traditional photolithography will encounter the difficulty for mass productions.

On the other hand, the nanoimprint technique is more convenient, simpler and easier, and such technique simply requires an imprinting mold and a transfer of a quick and repeating printing or patterning. In addition, the nanoimprint can lower costs, and the imprint technique can be applied for preparing patterns of a large area and thus greatly reduce production costs and increase productivity.

However, selecting the material for manufacturing the mold of a nanoimprint technique is still a problem. The material with high hardness used for making the mold incurs a high cost, but the material with low hardness cannot meet the requirements of the product. Additionally, in the traditional method of enhancing the surface hardness of the mold, a single diamond probe is used to imprint the mold via continuously and periodically indentations. It takes much more time to achieve the hardening phenomenon. If the hardness will be uniform, the pressure applied to the mold must be adjusted to be identical, and many variables might be existed in operating the single diamond probe.

Therefore, finding a way of lowering the cost of the mold and a way of saving time of operating the nano-indentation apparatus, and increasing the durability of the mold demands immediate attentions and feasible solutions.

In order to solve the problem with choosing materials for the mold and saving time of operating the nano-indentation apparatus, the inventor of the present invention based on years of experience in the related industry to conduct extensive researches and experiments, and finally proposed a feasible and effective solution by utilizing nanoindentation technology to enhance the nanoimprint mold.

SUMMARY OF THE INVENTION

The primary objective of the present invention is to provide a method for enhancing hardness of a nanoimprint mold, and particularly to a method for enhancing hardness of a nanoimprint mold by a nano-indentation apparatus having a diamond array probe.

To achieve the foregoing objective, the present invention provides a method for enhancing hardness of a nanoimprint mold. The method comprises following steps of: providing a male mold, composed of a first material, for imprinting a female mold and producing a nano structural pattern on the female mold, and the female mold composed of a second material, wherein the hardness of the first material is higher than the hardness of the second material; applying a nano-indentation technique to the female mold onto the female mold by a nano-indentation apparatus having a diamond array probe so as to enhance the surface hardness of the female mold; and impressing a substrate by the female mold with the nano structural pattern having the enhanced surface.

Therefore, the method for enhancing hardness of the nanoimprint mold in accordance with the present invention can process the large scale of surface area of the female mold to enhance the hardness just one time without the periodic indentation. That is, the method of the present invention is by a single indentation to create a different hardness enhancing mechanism.

To make it easier for our examiners to understand the technical characteristics and functions of the present invention, preferred embodiments accompanied with related drawings are used for the detailed description of the invention as follows.

BRIEF DESCRIPTION OF THE DRAWINGS

The following is a detailed description of preferred embodiments of the invention with reference to the accompanying drawings.

In the figures.

DETAILED DESCRIPTION OF THE PREFERRED EMBODIMENTS

Figure 1:
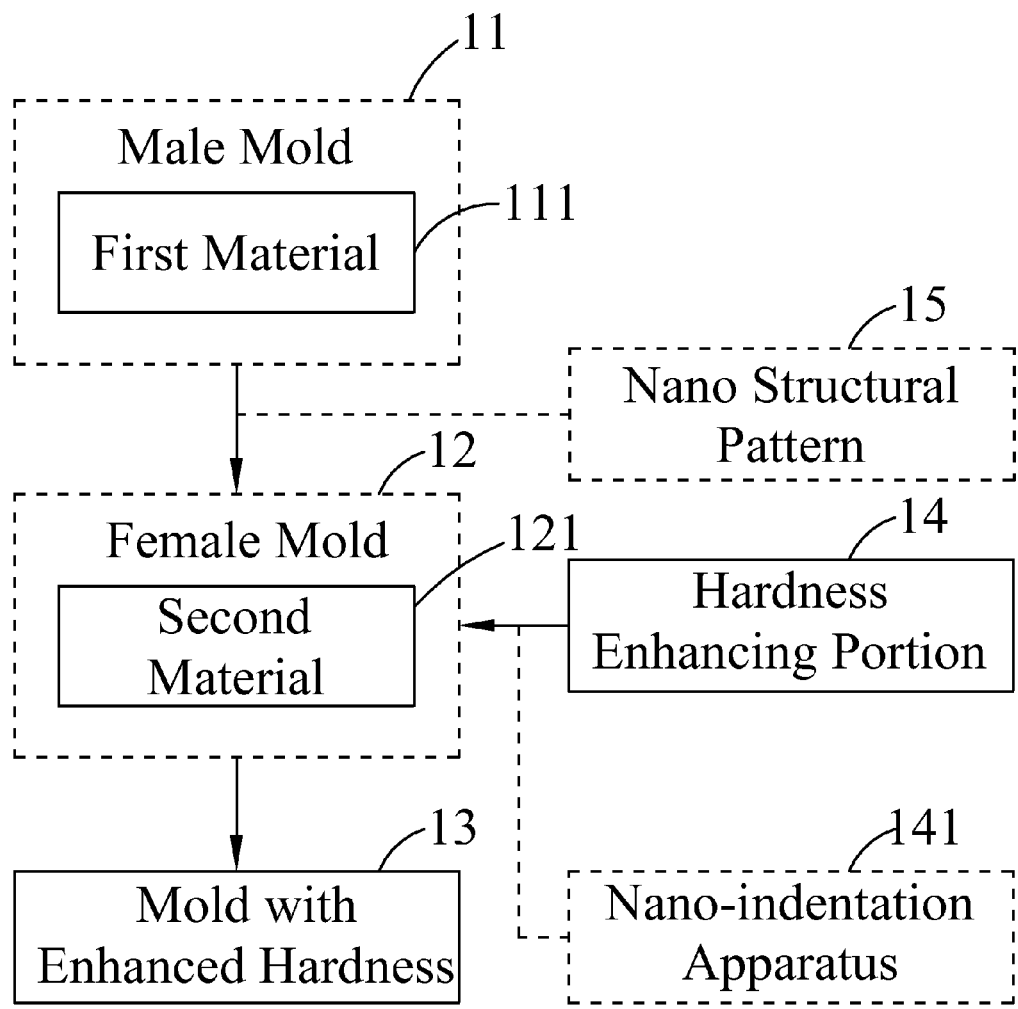
FIG. 1 is a block diagram of an apparatus for enhancing the hardness of a nanoimprint mold in accordance with the present invention.

In the following preferred embodiments of an apparatus for enhancing the hardness of a nanoimprint mold and a method thereof in accordance with the present invention, the same elements are represented by the same reference numerals for the illustration of the present invention.

Please refer to FIG. 1 for a block diagram of an apparatus for enhancing the hardness of a nanoimprint mold in accordance with the present invention. The apparatus comprises a female mold 12, a male mold 11 and a hardness enhancing portion 14. The male mold 11 may be composed of a first material 111 for imprinting the female mold 12 to produce a nano structural pattern 15 on the female mold 12. The female mold 12 may be composed of a second material 121, wherein the hardness of the first material 111 may be higher than the hardness of the second material 121. In the hardness enhancing portion, a nano-indentation apparatus 141 having a diamond array probe may be used, and a nano-indentation technique may be applied to the female mold 12 to enhance the surface hardness of the female mold 12, so as to obtain a mold with enhanced hardness 13.

The male mold 11 may be produced by photolithography, E-beam lithography, X-ray lithography or Focus ion-beam lithography, and the male mold 11 may be a mold having a precision nano structural pattern.

The hardness enhancing portion may be made by a physical method or a chemical method. The physical method comprises placing a nano-indentation apparatus having a diamond array probe above the female mold, and the nano-indentation apparatus can be a diamond probe. The chemical method comprises an anodic treatment method. The second material comprises zirconium.

In addition, the apparatus for enhancing hardness of a nanoimprint mold in accordance with the present invention may further comprise a substrate, and the female mold imprints the nano structural pattern on the substrate.

Figure 2:
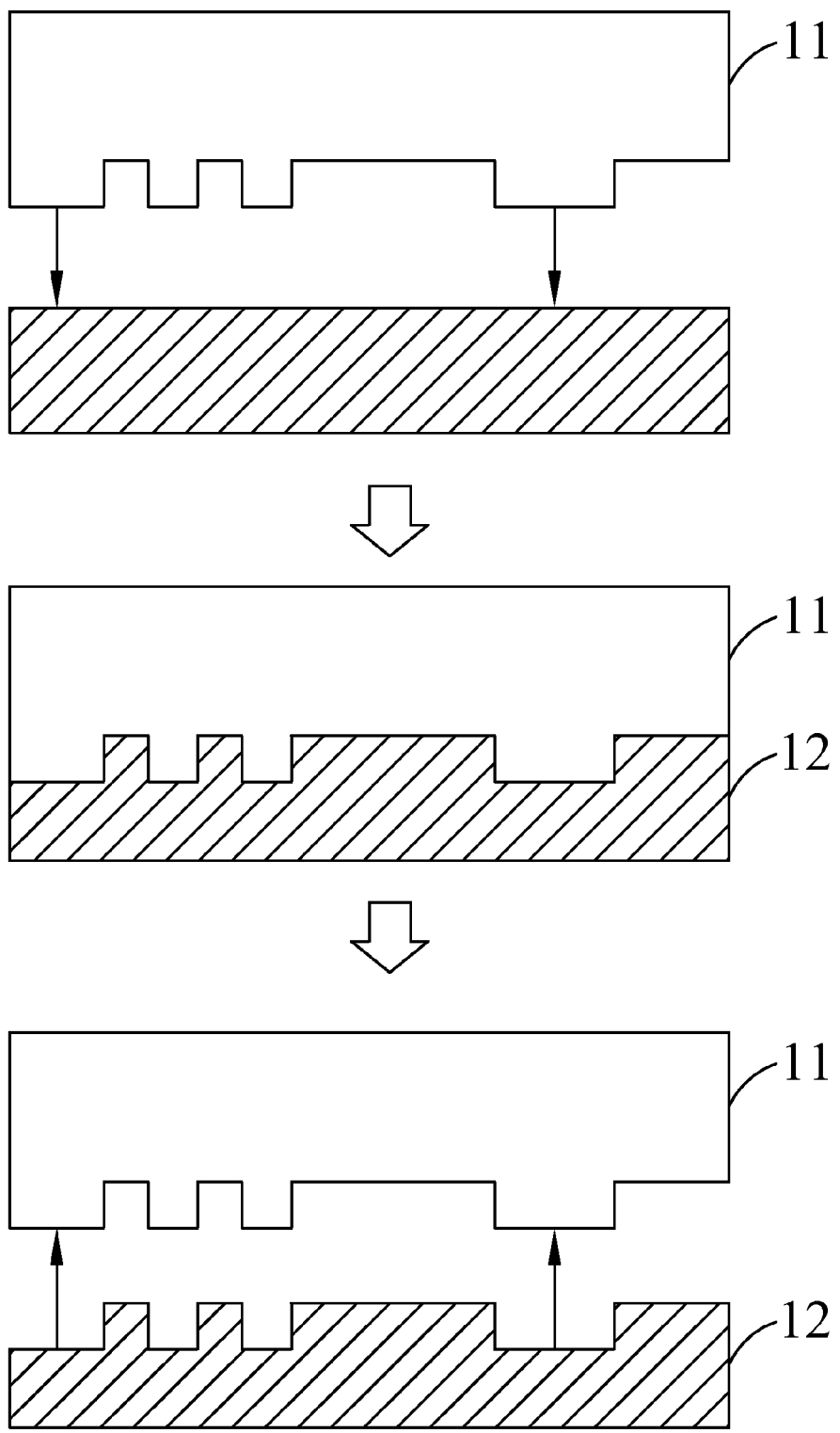
FIG. 2 is a schematic view of an apparatus for enhancing the hardness of a nanoimprint mold in accordance with a preferred embodiment of the present invention.

Please refer to FIG. 2 for a schematic view of an apparatus for enhancing the hardness of a nanoimprint mold in accordance with a preferred embodiment of the present invention, a method of manufacturing the female mold 12 is illustrated. Firstly, photolithography, E-beam lithography, X-ray lithography or Focus ion-beam lithography may be used for producing a male mold 11 having a precision nano structural pattern, and the male mold 11 may be made of a first material. Then, the male mold 11 imprints onto a female mold 12 made of a second material to form a nano structural pattern on the female mold 12. Finally, the male mold 11 is removed and then the manufacture of the female mold 12 is accomplished.

Figure 3:
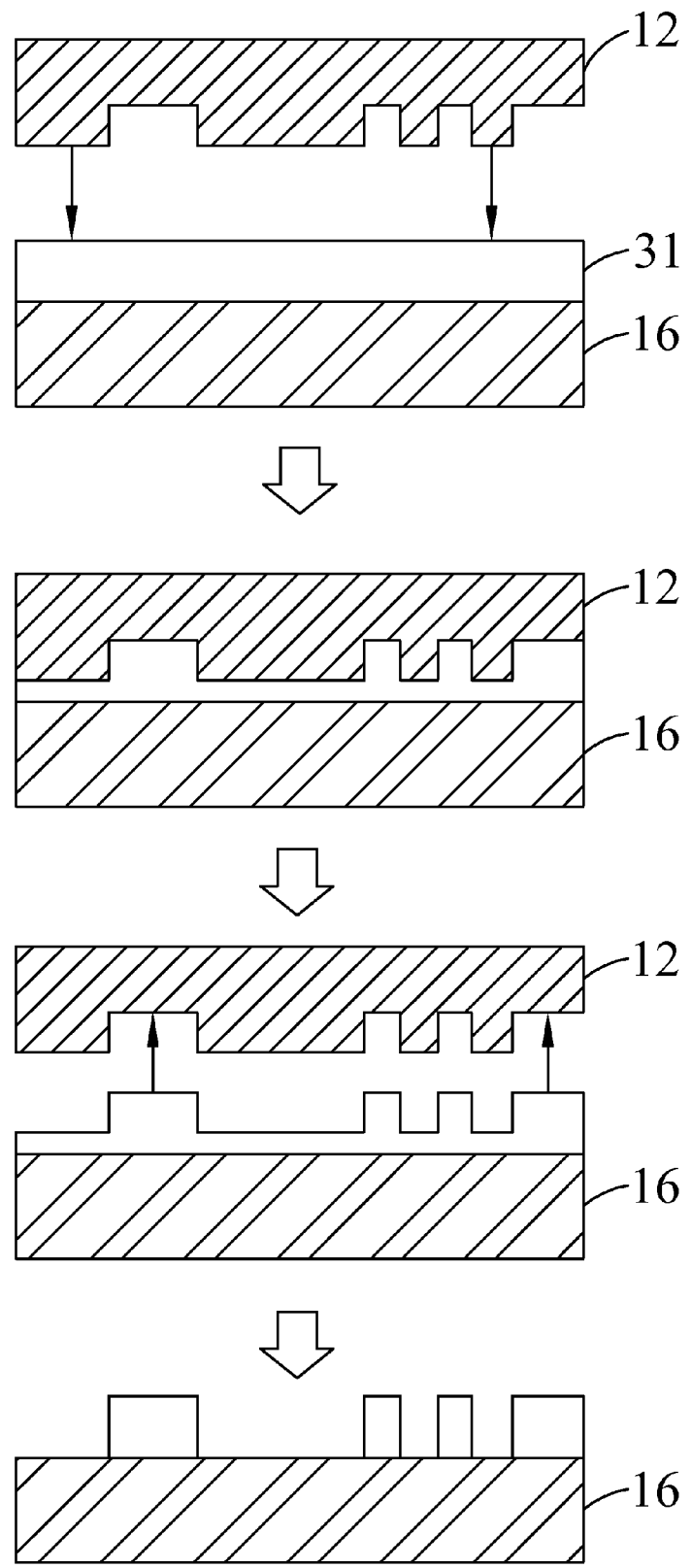
FIG. 3 is a schematic view of an apparatus for enhancing the hardness of a nanoimprint mold in accordance with further preferred embodiment of the present invention.

Please refer to FIG. 3 for a schematic view of an apparatus for enhancing the hardness of a nanoimprint mold in accordance with another preferred embodiment of the present invention, firstly the female mold 12 having a nano structural pattern imprints onto a photoresist layer 31 on a surface of a substrate 16, so that the nano structural pattern is transferred and printed onto the photoresist layer 31 of the substrate 16. Then, the female mold 12 is removed, and finally a Reactive Ion Etching (RIE) method is applied to remove any photoresist remained on the imprint area.

Figure 4:
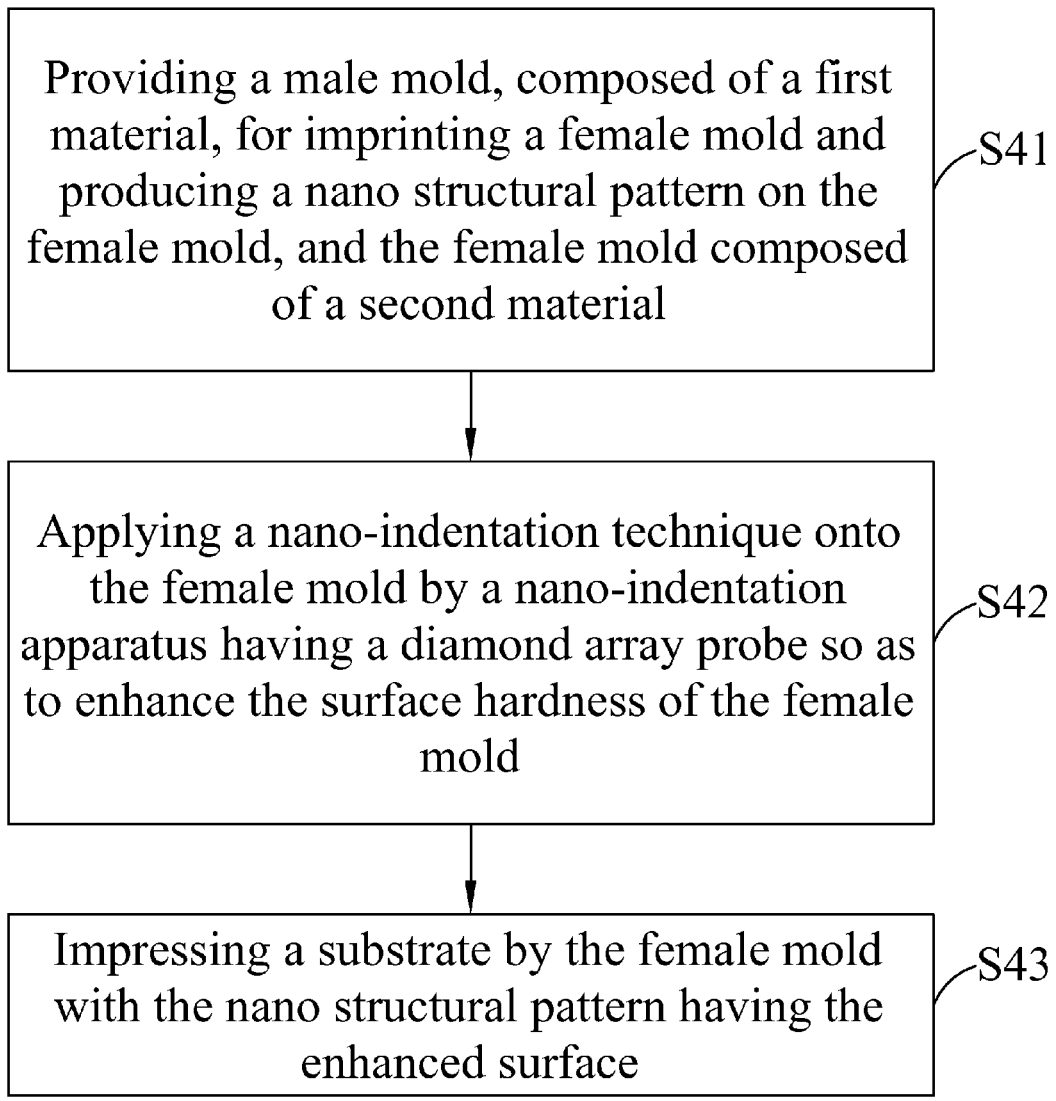
FIG. 4 is a flow chart of a method for enhancing the hardness of a nanoimprint mold in accordance with the present invention.

Please refer to FIG. 4 for a flow chart of a method for enhancing the hardness of a nanoimprint mold in accordance with the present invention. The method comprises the following steps. In step S41, a male mold composed of a first material is provided to produce a nano structural pattern on a female mold, and the female mold is composed of a second material, wherein the hardness of the first material is higher than the hardness of the second material. In step S42, a nano-indentation technique is applied onto the female mold by a nano-indentation apparatus having a diamond array probe so as to enhance the surface hardness of the female mold. In step S43, a substrate is impressed by the female mold with the nano structural pattern having the enhanced surface.

Figure 5:
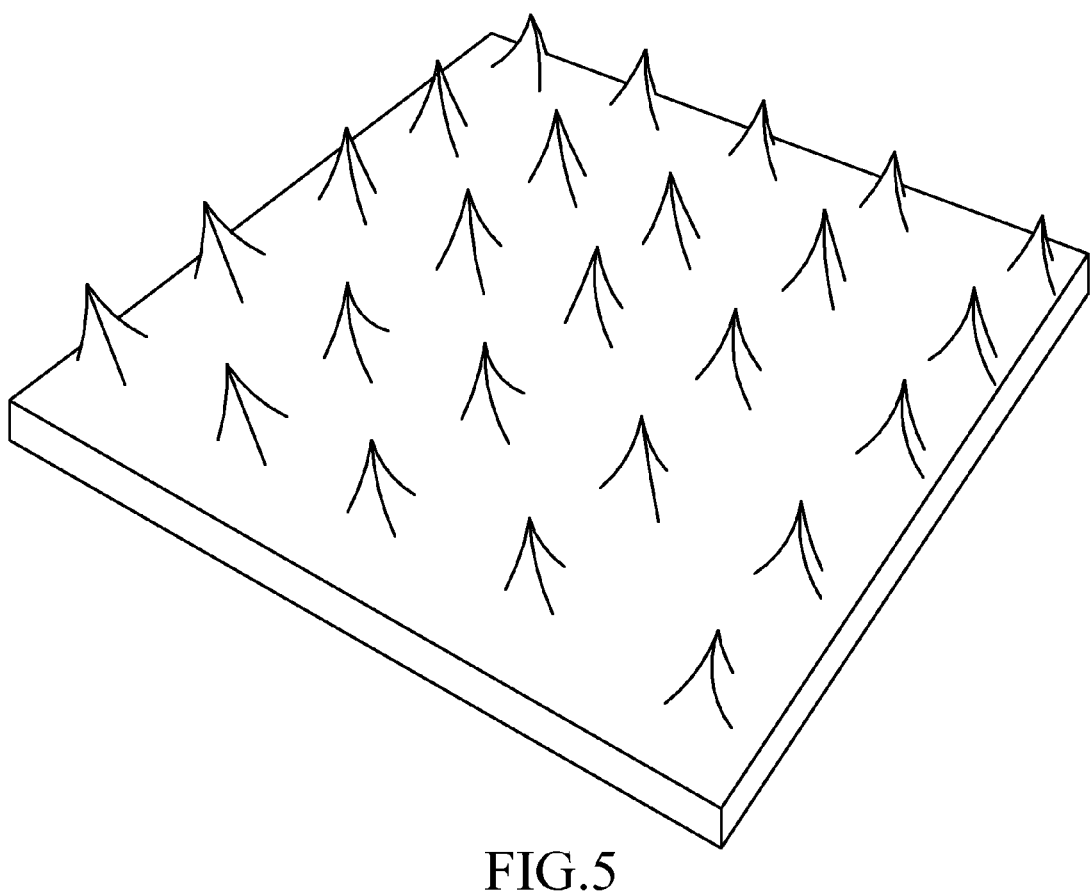
FIG. 5 is a diamond array probe according to an embodiment of the present invention.

Please refer to FIG. 5, the diamond array probe according to an embodiment of the present invention is shown. The height of the diamond array probe is in a range of 300 to 1000 nm. When the diamond array probe of the nano-indentation apparatus is impressed into the female, ⅓ of the height of the diamond array probe of the nano-indentation apparatus is inserted into the surface of the female mold, and the surface of the female mold then has permanent nano-spots. If the female mold is impressed by more than ⅓ of the height of the diamond array probe, the diamond array probe will be damaged such that the manufacturing cost might increase. The distance between the probes (as needles) is about in a range of 100 to 300 nm.

The pressure and time during the impression by the nano-indentation apparatus can be adjusted based on the material of the female mold. When the female mold is made of zirconium, the pressure during the impression by the nano-indentation apparatus must be bigger than the yielding strength of zirconium. This is because metals do not have the creep property, such that the time of impressing by the nano-indentation apparatus can not be limited. For example, the impressing time can be one or two seconds. Furthermore, for increasing the hardness of metals, the effect of the heat treatment and the effect of the method according to the present invention are the same.

The male mold may be produced by photolithography, E-beam lithography, X-ray lithography or Focus ion-beam lithography, and the male mold may be a mold having a precision nano structural pattern.

Furthermore, the hardness enhancing portion may be made by a physical method or a chemical method, and the physical method comprises placing a nano-indentation apparatus above the female mold (as shown above description). The chemical method comprises an anodic treatment method. The second material may be zirconium.

From above, the method of the present invention can process the large scale of surface area of the female mold to enhance the hardness just one time other than continuously and periodically indentation.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method for enhancing hardness of a nanoimprint mold, comprising:
providing a male mold, composed of a first material, for imprinting a female mold and producing a nano structural pattern on the female mold, and the female mold composed of a second material, wherein the hardness of the first material is higher than the hardness of the second material;
applying a nano-indentation technique onto the female mold by a nano-indentation apparatus having a diamond array probe so as to enhance the surface hardness of the female mold, wherein a height of the diamond array probe is in a range of 300 to 1000 nm; and
impressing a substrate by the female mold with the nano structural pattern having the enhanced surface.

2. The method for enhancing hardness of a nanoimprint mold according to claim 1, wherein ⅓ of the height of the diamond array probe of the nano-indentation apparatus is impressed into the female mold.

3. The method for enhancing hardness of a nanoimprint mold according to claim 1, wherein the male mold is produced by using photolithography, E-beam lithography, X-ray lithography or Focus ion-beam lithography.

4. The method for enhancing hardness of a nanoimprint mold according to claim 1, wherein the second material is zirconium.

* * * * *